United States Patent
Harendt (10) Patent No.: US 11,929,455 B2
(45) Date of Patent: Mar. 12, 2024

(54) OPTOELECTRONIC COMPONENT

(71) Applicant: OSRAM OLED GmbH, Regensburg (DE)

(72) Inventor: Norbert Harendt, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 56 days.

(21) Appl. No.: 16/635,566

(22) PCT Filed: Jul. 31, 2018

(86) PCT No.: PCT/EP2018/070771
§ 371 (c)(1),
(2) Date: Jan. 31, 2020

(87) PCT Pub. No.: WO2019/025456
PCT Pub. Date: Feb. 7, 2019

(65) Prior Publication Data
US 2020/0168773 A1    May 28, 2020

(30) Foreign Application Priority Data

Aug. 2, 2017  (DE) .................. 10 2017 117 488.5

(51) Int. Cl.
*H01L 33/50*    (2010.01)

(52) U.S. Cl.
CPC .......... *H01L 33/508* (2013.01); *H01L 33/504* (2013.01); *H01L 2933/0041* (2013.01)

(58) Field of Classification Search
CPC .............. H01L 33/508; H01L 33/504; H01L 2933/0041; F21V 9/38
See application file for complete search history.

(56) References Cited

U.S. PATENT DOCUMENTS 8,962,361 B2    2/2015  Petersen et al.
10,014,451 B2*  7/2018  Hotta .................. H01L 33/56
(Continued)

FOREIGN PATENT DOCUMENTS

DE    102007057710 A1    4/2009
DE    102010061848 A1    5/2012
(Continued)

OTHER PUBLICATIONS

Search Report for the corresponding German Patent Application No. 10 2017 117 488.5 (8 pages) dated Jun. 22, 2018 (for reference purpose only).
(Continued)

*Primary Examiner* — Sarah K Salerno
(74) *Attorney, Agent, or Firm* — VIERING, JENTSCHURA & PARTNER MBB (57) ABSTRACT

An optoelectronic component may include a layer sequence having an active layer configured to emit an electromagnetic primary radiation and a conversion element arranged in the beam path of the primary radiation. The conversion element may include a conversion layer and a conversion potting arranged over the conversion layer. The conversion layer may include a first matrix material and a converter material, and the conversion potting may include a second matrix material and a converter material. There may be a jump in concentration of converter material between the conversion layer and the conversion potting.

19 Claims, 6 Drawing Sheets

(56) References Cited

U.S. PATENT DOCUMENTS

| | | | |
|---|---|---|---|
| 2003/0080341 A1* | 5/2003 | Sakano | H01L 33/54 |
| | | | 257/79 |
| 2004/0100192 A1* | 5/2004 | Yano | H01L 33/54 |
| | | | 313/512 |
| 2005/0040424 A1* | 2/2005 | Erchak | G03B 21/204 |
| | | | 257/E33.068 |
| 2006/0138938 A1* | 6/2006 | Tan | H01L 33/504 |
| | | | 313/503 |
| 2008/0198573 A1* | 8/2008 | Justel | C09K 11/7769 |
| | | | 257/E33.061 |
| 2008/0210961 A1* | 9/2008 | Lin | H01L 33/508 |
| | | | 257/E33.001 |
| 2010/0237370 A1* | 9/2010 | Kim | H01L 33/504 |
| | | | 257/E33.061 |
| 2011/0156071 A1* | 6/2011 | Cheng | H01L 33/44 |
| | | | 257/E33.056 |
| 2012/0217523 A1* | 8/2012 | Chang | H01L 33/504 |
| | | | 257/E33.072 |
| 2015/0002012 A1* | 1/2015 | Choi | H01L 22/12 |
| | | | 445/3 |
| 2015/0200339 A1 | 7/2015 | Markytan et al. | |
| 2017/0018692 A1* | 1/2017 | Oh | H01L 33/504 |
| 2017/0084502 A1 | 3/2017 | Kim et al. | |
| 2018/0062051 A1* | 3/2018 | Haiberger | H01L 33/486 |
| 2018/0175239 A1* | 6/2018 | Hayashi | H01L 33/46 |
| 2018/0261734 A1* | 9/2018 | Herrmann | H01L 33/54 |
| 2019/0137072 A1* | 5/2019 | Vissenberg | G02B 6/0021 |
| 2019/0386183 A1* | 12/2019 | Frischeisen | H01L 33/504 |
| 2019/0386186 A1* | 12/2019 | Pindl | H01L 33/52 |
| 2021/0005789 A1* | 1/2021 | Haiberger | H01L 33/60 |

FOREIGN PATENT DOCUMENTS

| | | |
|---|---|---|
| EP | 1693904 A2 | 8/2006 |
| JP | 2007035885 A | 2/2007 |
| JP | 2008200066 A | 9/2008 |
| WO | 2009039801 A1 | 4/2009 |
| WO | 2014023617 A1 | 2/2014 |
| WO | WO-2016146681 A1 * | 9/2016 ............ H01L 33/10 |

OTHER PUBLICATIONS

International Search Report for the corresponding PCT Application No. PCT/EP2018/070771 (15 pages) dated Oct. 10, 2018 (for reference purpose only).

* cited by examiner

OPTOELECTRONIC COMPONENT

CROSS-REFERENCE TO RELATED APPLICATIONS

The present application is a national stage entry according to 35 U.S.C. § 371 of PCT application No.: PCT/EP2018/070771 filed on Jul. 31, 2018; which claims priority to German Patent Application Serial No.: 10 2017 117 488.5, which was filed on Aug. 2, 2017; which is incorporated herein by reference in its entirety and for all purposes.

TECHNICAL FIELD

The invention relates to an optoelectronic component and to a method for producing an optoelectronic component.

BACKGROUND

Optoelectronic components such as light emitting diodes (LEDs), for example, often include conversion elements including a converter material. Converter materials convert the primary radiation emitted by a radiation source wholly or partly into a secondary radiation having an altered, for example longer, wavelength. In order to generate white light, a blue emitting semiconductor chip and converter materials emitting in the green and red or in the yellow spectral range are often used. Superimposing the blue, green and red or the blue and yellow radiation gives rise to white light. What is problematic here is that the primary radiation and the secondary radiation are emitted with different intensity ratios depending on emission angle and embodiment of the conversion element, which results in a different color impression for an observer depending on the viewing angle of the optoelectronic component. By way of example, this is manifested as blue-yellow segregation in light projection.

The color homogeneity depending on the emission angle can be increased for example by scattering particles being added to the conversion element, such that the primary radiation and the secondary radiation have constant intensity ratios as a result of scattering at different emission angles. However, this results in a loss of efficiency for the optoelectronic component since the probability of the occurrence of scattering losses and reabsorption losses rises owing to the presence of scattering particles.

SUMMARY

Therefore, it is an object of at least one embodiment to provide an optoelectronic component having improved properties with regard to color homogeneity and efficiency by comparison with the prior art. A further object is to specify a method for producing such an optoelectronic component.

The objects are achieved by means of an optoelectronic component having the features of claim 1 and by means of a method for producing an optoelectronic component having the features of claim 11.

Advantageous embodiments and developments are specified in each case in the dependent claims.

An optoelectronic component is specified. The optoelectronic component includes a layer sequence having an active layer, which emits an electromagnetic primary radiation during operation of the component, and a conversion element, which is arranged in the beam path of the electromagnetic primary radiation and above the layer sequence. The conversion element includes a conversion layer and a conversion potting arranged thereabove. In other words, the conversion potting is disposed downstream of the conversion layer in the beam path of the electromagnetic primary radiation.

In accordance with at least one embodiment, the conversion layer includes a first matrix material and a converter material and the conversion potting includes a second matrix material and a converter material, wherein there is a jump in concentration of converter material between the conversion layer and the conversion potting. In this case, in particular, the concentration of converter material can suddenly or abruptly decrease with increasing distance from the layer sequence. The converter material is configured to convert the electromagnetic primary radiation partly into an electromagnetic secondary radiation during operation of the component.

As a result of the jump in concentration of converter material between the conversion layer and the conversion potting, the concentration of converter material is in particular higher in the conversion layer than in the conversion potting.

In accordance with at least one embodiment, the concentration of the converter material, in particular the concentration of the substance amount of the converter material, in the conversion layer is at least three times, such as at least five times, alternatively at least ten times, as high as the concentration of the converter material in the conversion potting. In particular, the conversion layer is produced by sedimentation.

In accordance with at least one embodiment, the concentration of the substance amount of the converter material within the conversion layer is greater than that of the substance amount of converter material in the conversion potting.

In accordance with at least one embodiment, the substance amount of the converter material within the conversion layer is 80% to 97% inclusive relative to the total substance amount of converter material in the conversion element.

The substance amount, designated by n, indirectly specifies the number of particles in a substance portion. The substance amount n can be calculated from n=M/m, wherein M indicates the molar mass in g/mol and m indicates the weight in g. The substance amount is known to a person skilled in the art.

In this case, the fact that one layer or one element is arranged or applied "on" or "above" another layer or another element can mean here and hereinafter that said one layer or said one element is arranged directly in direct mechanical and/or electrical contact on the other layer or the other element. It can furthermore also mean that said one layer or said one element is arranged indirectly on or above the other layer or the other element. In this case, further layers and/or elements can then be arranged between said one layer or the other layer and/or between said one element or the other element.

The fact that a converter material converts the electromagnetic primary radiation partly into an electromagnetic secondary radiation means that the electromagnetic primary radiation is partly absorbed by the converter material and is emitted as secondary radiation having a wavelength range that is at least partly different than the primary radiation. In the case of this so-called partial conversion, the optoelectronic component emits an overall radiation composed of the primary radiation and the secondary radiation.

In this context, "layer sequence" should be understood to mean a layer sequence including more than one layer, for example a sequence of a p-doped and an n-doped semiconductor layer, wherein the layers are arranged one above another and wherein at least one active layer which emits the electromagnetic primary radiation is contained.

The layer sequence can be embodied as an epitaxial layer sequence or as a radiation-emitting semiconductor chip including an epitaxial layer sequence, that is to say as a semiconductor layer sequence grown epitaxially. In this case, the layer sequence can be embodied on the basis of InGaAlN, for example. InGaAlN-based semiconductor chips and semiconductor layer sequences are, in particular, those in which the semiconductor layer sequence produced epitaxially includes a layer sequence composed of different individual layers which contains at least one individual layer including a material from the III-V compound semiconductor material system $In_xAl_yGa_{1-x-y}N$ where $0 \le x \le 1$, $0 \le y \le 1$ and $x+y \le 1$. Semiconductor layer sequences including at least one active layer on the basis of InGaAlN emit, in particular, an electromagnetic radiation in the blue wavelength range of the electromagnetic spectrum.

Besides the active layer, the active semiconductor layer sequence may include further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and combinations thereof. Furthermore, one or more mirror layers can be applied for example on a side of the semiconductor layer sequence facing away from the growth substrate. The structures described here, concerning the active layer or the further functional layers and regions, are known to the person skilled in the art in particular with regard to construction, function and structure and will therefore not be explained in greater detail at this juncture.

In accordance with at least one embodiment, the layer sequence has two main surfaces and side surfaces, in particular a plurality of side surfaces. In this case, the radiation exit surface is one main surface of the layer sequence. The radiation exit surface extends in particular parallel to a main plane of extent of the semiconductor layers of the layer sequence. It is possible for the two main surfaces and/or the radiation exit surface to have a rectangular or square geometry or to have a triangular, hexagonal or octagonal basic area.

In accordance with at least one embodiment, the primary radiation emerges from the layer sequence via the radiation exit surface and the side surfaces. In particular, that proportion of primary radiation which is emitted via the side surfaces is higher than that proportion of primary radiation which is emitted via the radiation exit surface. In other words, the primary radiation is not emitted with a Lambertian radiation distribution, rather toward high emission angles the intensity of the primary radiation rises by comparison with a Lambertian radiation distribution. The layer sequence may include a sapphire substrate.

In accordance with at least one embodiment, the layer sequence has two rectangular or square main surfaces and four side surfaces.

In accordance with at least one embodiment, the conversion layer is arranged above one main surface, in particular the radiation exit surface, and the side surfaces of the layer sequence.

According to a non-limiting embodiment, within a conversion element, a conversion layer and a conversion potting are combined with one another. As a result, for different emission angles it is possible to obtain approximately identical intensity ratios of the primary radiation and the secondary radiation and thus to obtain a high color homogeneity of the overall radiation emitted by the component. Moreover, the luminous flux and thus the efficiency of the component are increased in comparison with components including only a conversion layer or a conversion potting. Moreover, the substance amount of converter material can be reduced in comparison with conversion elements consisting of a conversion layer or a conversion potting, without the color locus of the overall radiation being changed.

According to a non-limiting embodiment, firstly, the total substance amount of converter material required within the conversion element can be determined on the basis of the color locus to be achieved for the overall radiation. Firstly, in accordance with one embodiment, 90% of the converter material required is then introduced into the conversion layer. In order to correctly set the desired color locus, a corresponding amount of converter material is introduced into the conversion potting. In this case, the concentration of converter material in the conversion layer is greater than that in the conversion potting; in particular, the concentration of converter material decreases abruptly or suddenly upon transition from the conversion layer to the conversion potting. The color locus is thus substantially determined by the converter material in the conversion layer, whereas the converter material in the conversion potting serves for correction or fine tuning of the color locus. The converted secondary radiation emerges from the conversion layer with a Lambertian radiation distribution, while the unconverted primary radiation is typically not emitted with a Lambertian radiation distribution. In particular, the embodiment of the conversion element is suitable for primary radiations having increasing intensity ratios by comparison with Lambertian radiation distributions toward high emission angles, i.e. if the primary radiation is emitted with higher intensity toward higher emission angles and thus via the side surfaces of the layer sequence. This is manifested in particular in decreasing color coordinates CIEx and CIEy within the CIE color space. The non-converted primary radiation passes from the conversion layer into the conversion potting and is partly converted there into the secondary radiation by the converter material. The unconverted primary radiation emerges from the conversion potting with changed intensity ratios depending on emission angle, wherein the intensity ratios of the primary radiation decrease toward higher emission angles. This is manifested in particular in increasing color coordinates CIEx and CIEy within the CIE color space. This oppositely occurring intensity distribution of the primary radiation upon emergence from the conversion layer and the conversion potting results in intensity ratios of the primary radiation and secondary radiation that are constant or almost constant over the emission angles, and thus in a very good color homogeneity of the overall radiation and a constant or almost constant color locus of the overall radiation over the emission angles. In other words, the chromatic aberration that arises as a result of the conversion layer, said chromatic aberration being dependent on the emission angle, can be corrected by the conversion potting. As a result of the uniform intensity distribution—obtained in this way—of the emitted primary radiation and secondary radiation over the emission angles, the optoelectronic component has a homogeneous emission characteristic, that is to say that the color locus of the overall radiation does not change or hardly changes depending on the viewing angle.

By way of example, between 80% and 97% inclusive of the substance amount of the converter material relative to the (required) total substance amount of converter material in the conversion element is introduced into the conversion layer. Accordingly, the substance amount of the converter material that is introduced into the conversion potting is such that the color locus of the overall radiation is set correctly.

The CIE color space (1931) is a two-dimensional representation of the three-dimensional color space perceived by an observer. In this case, CIEx represents the color red, CIEy represents the color green and CIEz represents the color blue. For the two-dimensional representation, CIEy is plotted against CIEx and CIEz can be calculated in accordance with CIEx+CIEy+CIEz=1. The CIE color space (1931) is known to a person skilled in the art.

In accordance with at least one embodiment, substance amount of the converter material within the conversion potting is 3% to 20%, in particular 4 to 16%, such as 10%, relative to the total substance amount of converter material in the conversion element. This has proved to be particularly advantageous for a homogeneous emission characteristic or a constant color locus over the emission angles of the overall radiation. This can vary further, however, depending on height of the layer sequence, layer thickness of the conversion layer, distance between the conversion potting and the conversion layer, geometry of the surfaces through which radiation passes, and thickness of the conversion potting.

In accordance with at least one embodiment, the substance amount of the converter material within the conversion layer is 80 to 97% inclusive, such as 84% to 96% inclusive, alternatively 90%, relative to the total substance amount of converter material in the conversion element. This has proved to be particularly advantageous for a homogeneous emission characteristic or a constant color locus over the emission angles of the overall radiation. This can vary further, however, depending on height of the layer sequence, layer thickness of the conversion layer, distance between the conversion potting and the conversion layer, geometry of the surfaces through which radiation passes, and thickness of the conversion potting.

In one embodiment, the emitted primary radiation of the active layer of the layer sequence lies in the blue range of the electromagnetic spectrum. In this case, in the blue range of the electromagnetic spectrum can mean, in particular, that the emitted primary radiation has a peak wavelength of between 420 nm and 480 nm inclusive, such as between 430 nm and 460 nm inclusive.

In the present case, "peak wavelength" denotes that wavelength of a peak at which the maximum intensity of the peak lies.

The side surfaces of the layer sequence can be partly or completely covered by the conversion layer. In particular, the complete or partial covering of the side surfaces can be chosen depending on the ratio of the thickness or height of the layer sequence to the thickness of the conversion layer.

In accordance with at least one embodiment, the conversion layer has a direct mechanical contact with the layer sequence, in particular with the radiation exit surface, and alternatively with the radiation exit surface and the side surfaces of the layer sequence.

In accordance with at least one embodiment, the conversion potting envelops the conversion layer in a positively locking manner. Furthermore, the conversion potting can be stabilized for example by a housing at the sidewalls and is situated for example in a cutout of such a housing.

In accordance with at least one embodiment, the converter material includes at least one phosphor or consists of a phosphor. If the converter material includes a phosphor or consists of a phosphor, the latter emits in particular a secondary radiation in the yellow range of the electromagnetic spectrum. It is also possible for the converter material to include a first and a second phosphor or to consist of a first and a second phosphor. In accordance with this embodiment, the first phosphor emits in particular a secondary radiation in the red range of the electromagnetic spectrum and the second phosphor emits in particular a secondary radiation in the green range of the electromagnetic spectrum. As a result of the combination of a blue primary radiation and a yellow secondary radiation or of a blue primary radiation and a green and red secondary radiation, the component can emit a white overall radiation. The white overall radiation can be in particular a mixed radiation composed of the primary radiation in the blue spectral range and the secondary radiation in the yellow or in the green and red spectral range. It is also possible for the converter material to include further phosphors. The converter material of the conversion layer and the converter material of the conversion potting can be chosen to be identical or different. In a non-limiting embodiment, the converter material of the conversion layer and the converter material of the conversion potting are identical.

In accordance with at least one embodiment, the converter material includes a first and a second phosphor or a first, a second and a further phosphor. The first and second phosphors or the first, second and further phosphors can be distributed homogeneously in the converter layer or can be arranged within the converter layer in two or more partial layers each having a phosphor.

If the converter material contains a first and a second phosphor or the converter material consists of a first and a second phosphor, it is advantageous to employ the first and second phosphors within the conversion layer and the conversion potting in the same ratio to one another. In other words, the composition of the converter material in the conversion layer and in the conversion potting is identical, but the converter material is present in the conversion layer in a greater concentration than in the conversion potting. However, it can also be advantageous to choose the ratios of the phosphors to one another differently in the conversion potting than in the conversion layer.

A phosphor that emits a secondary radiation in the yellow or green range of the electromagnetic spectrum is for example a garnet phosphor having the formula $(Y,Lu,Gd,Ce)_3(Al,Ga)_5O_{12}$ or $(Y,Lu,Gd,Ce)_3Al_5O_{12}$.

A phosphor that emits a secondary radiation in the red range of the electromagnetic spectrum has for example the formula $(Ca,Sr,Ba,Eu)AlSiN_3$ or $Sr(Sr_aCa_{1-a})Si_2N_6:Eu$, wherein $0.7 \leq a$, such as $0.8 \leq a$, alternatively $0.84 \leq a$.

In accordance with at least one embodiment, the component emits a white overall radiation. In a non-limiting embodiment, the white overall radiation has a correlated color temperature (CCT) of between 2000 K and 6000 K, such as between 2000 K and 4000 K, for example 3000 K. In particular, the required total substance amount and composition of converter material are determined on the basis of the desired correlated color temperature of the white color locus.

In accordance with at least one embodiment, the phosphor, the first, second or further phosphor, constitutes particles of the corresponding phosphor.

The particles of the phosphor or of the first and the second phosphors, independently of one another, can have a mean grain size of between 500 nm and 1000 μm, such as between 1 μm and 50 μm. With these grain sizes, the primary radiation and/or the secondary radiation are/is scattered at these particles advantageously to a small extent or primarily in the forward direction, which reduces losses of efficiency.

In accordance with at least one embodiment, the volume of the conversion potting is greater than the volume of the conversion layer.

In accordance with at least one embodiment, the conversion layer has a layer thickness of between 50 µm and 150 µm inclusive.

In accordance with at least one embodiment, the thickness or height of the layer sequence is greater than the layer thickness of the conversion layer.

In accordance with one embodiment, the layer thickness of the conversion potting can be between 100 µm and 1000 µm inclusive.

In accordance with at least one embodiment, the converter material is distributed homogeneously in the conversion potting and/or the conversion layer.

In accordance with at least one embodiment, the converter material is distributed with a concentration gradient in the conversion layer. In other words, the converter material is distributed inhomogeneously within the conversion layer. In a non-limiting embodiment, the concentration of converter material decreases with increasing distance from the layer sequence. In particular, a conversion layer in accordance with this embodiment is produced by sedimentation, such that in particular the concentration of the converter material at the interface with the layer sequence is very high, while the concentration at the interface with the conversion potting decreases to zero.

In accordance with at least one embodiment, a matrix layer is arranged between the conversion layer and the conversion potting. The matrix layer includes or consists of the first matrix material. In particular, the matrix layer covers the conversion layer over the whole area and is in direct mechanical contact with the conversion potting and the conversion layer. In accordance with this embodiment, the conversion element thus includes the conversion layer, the matrix layer and the conversion potting. In particular, the matrix layer contains no converter material. In a non-limiting embodiment, there is a jump in concentration of converter material between the conversion layer and the matrix layer and between the conversion layer and the conversion potting.

If the optoelectronic component includes a matrix layer that is free of converter material, this makes it possible to increase the efficacy of the component. An increase in efficiency is achieved which can be attributed to a reduction of the color-over-angle aberration.

In accordance with one embodiment, the conversion element consists of the conversion layer, the matrix layer and the conversion potting.

In accordance with at least one embodiment, the conversion layer consists of the first matrix material and the converter material and the matrix layer consists of the first matrix material.

In accordance with at least one embodiment, the conversion layer has a layer thickness of between 50 and 150 µm inclusive and the matrix layer has a layer thickness of between zero and 450 µm. In particular, the layer thickness of the conversion layer and of the matrix layer together is between 50 and 500 µm.

In accordance with at least one embodiment, the matrix layer includes the first matrix material and scattering particles or consists of the first matrix material and scattering particles. The primary radiation and/or the secondary radiation can be scattered at the scattering particles, as a result of which the homogeneous emission characteristic of the overall radiation is improved once again. The scattering particles are in particular not provided for converting the primary radiation or the secondary radiation.

In accordance with at least one embodiment, the conversion potting envelops the matrix layer in a positively locking manner.

In accordance with at least one embodiment, the first matrix material and the second matrix material are identical. By way of example, the first and second matrix materials are the same silicone.

In accordance with at least one embodiment, the optoelectronic component includes a housing. A cutout can be present in the center in the housing. The layer sequence can be fitted in the cutout.

In accordance with at least one embodiment, the cutout of the housing is filled with the conversion potting.

In accordance with at least one embodiment, further conversion layers can be present in the component.

It is possible for further layers and/or optical elements to be arranged above the conversion potting.

In accordance with at least one embodiment, the component includes at least one further layer sequence for emitting a primary radiation and the conversion element is arranged in the beam path of the electromagnetic primary radiation of the at least one further layer sequence.

A method for producing an optoelectronic component is specified. All features of the optoelectronic component are also applicable to the method for producing an optoelectronic component, and vice versa.

The method for producing an optoelectronic component includes the following method:
A) Providing a layer sequence having an active layer;
B) Applying a first matrix material and a converter material to the layer sequence;
C) Sedimenting the converter material in order to form a conversion layer;
D) Applying a conversion potting above the conversion layer including a second matrix material and the converter material.

Sedimenting the converter material in method step C) can be brought about solely by the force of gravity or by centrifugation. As a result of the sedimentation, the conversion layer arises adjacent to the layer sequence, in which the converter material is situated in a high concentration. A matrix layer arranged above the conversion layer forms at the same time, said matrix layer containing the first matrix material and in particular no converter material. In particular, the conversion layer and the conversion potting are applied such that there is a jump in concentration of converter material between the conversion layer and the conversion potting. In this case, in particular, the concentration of converter material can suddenly or abruptly decrease with increasing distance from the layer sequence, in particular upon the transition of the conversion layer to the conversion potting.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

DETAILED DESCRIPTION

Figure 1A:
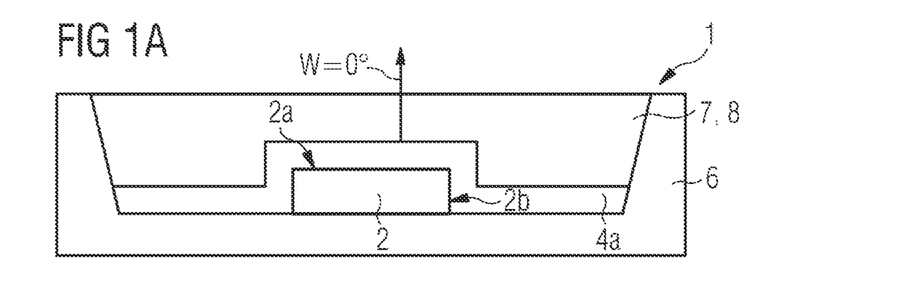
FIGS. 1A, 1B and 2A show optoelectronic components in accordance with the prior art.

FIG. 1A shows an optoelectronic component 1 as a comparative example. The optoelectronic component 1 includes a housing 6 having a cutout 7. A layer sequence 2 having an active layer (not shown here) is arranged in the cutout 7. The layer sequence 2 is arranged above a substrate, for example composed of sapphire, in the cutout 7 of the housing (not shown here). During operation of the component 1, the layer sequence 2 emits an electromagnetic primary radiation in the blue range of the electromagnetic spectrum. The layer sequence 2 is volume emitting, that is to say that the radiation is emitted via the radiation exit surface 2a and the side surfaces 2b. In the case of the layer sequence 2 in accordance with this embodiment, a higher proportion of primary radiation is emitted via the side surfaces 2b than via the radiation exit surface 2a. In other words, the primary radiation is not emitted with a Lambertian radiation distribution, rather the intensity of primary radiation rises toward high emission angles. A conversion layer 4a is arranged above the layer sequence 2. The conversion layer 4a consists of a first matrix material and a converter material. The converter material is, in particular, a phosphor which emits in the yellow spectral range and which converts the blue primary radiation partly into a yellow secondary radiation. A silicone can be chosen as first matrix material. A potting 8 is arranged above the conversion layer 4a, said potting completely filling the cutout 7 of the housing 6 and consisting of a matrix material, for example of silicone. The component emits a white overall radiation. An emission angle W of the overall radiation of 0° is perpendicular to the radiation exit surface 2a of the layer sequence 2 and is identified by W=0° in FIG. 1A. The primary radiation and the secondary radiation have different intensity ratios depending on emission angles. In particular, the intensity of primary radiation rises toward high emission angles. This is elucidated in FIG. 1B in the length of the arrows of the primary radiation ($S_{prim}$), which is small in the case of small emission angles, for example in the case of 0°, and increases toward larger emission angles, for example 90°.

Figure 1B:
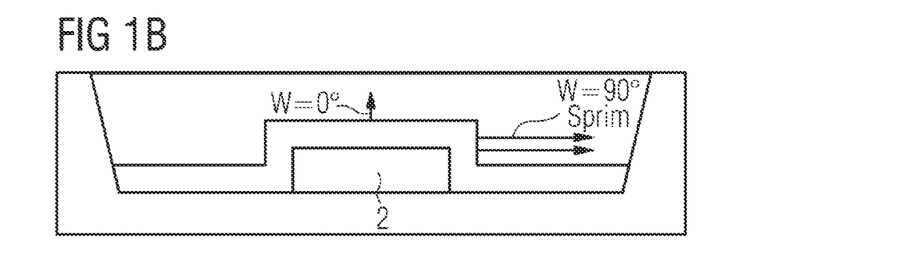

This results in a change in the perceived color of the white overall radiation depending on the viewing angle of the component. In this case, the proportion of blue primary radiation in the white overall radiation rises toward larger emission angles. This is manifested in particular in decreasing color coordinates CIEx and CIEy toward larger emission angles. This problem becomes particularly apparent if the ratio of primary radiation coupled out to secondary radiation coupled out is high, that is to say for example if cold-white light having a high proportion of blue primary radiation is intended to be coupled out.

Figure 1C:
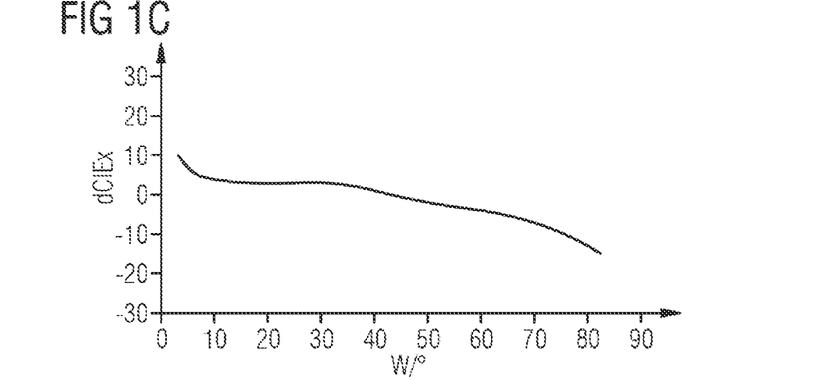
FIGS. 1C, 2B and 3C show the change in the color coordinate CIEx as a function of the emission angle.

The diagram illustrated in FIG. 1C shows the profile of the change in the color coordinate CIEx within the CIE color space $dCIE_x$ as a function of the emission angle of the overall radiation W of the optoelectronic component illustrated in FIG. 1A and FIG. 1B, respectively. In this case, the emission angle W in degrees is plotted on the x-axis and the change in the color coordinate CIEx within the CIE color space dCIEx is plotted on the y-axis. dCIEx is calculated as follows: 1000 (CIEx−$CIEx_0$), wherein CIEx corresponds to the ascertained value at the respective emission angle and $CIEx_0$ corresponds to the value averaged over the entire emission. An emission angle W of the overall radiation of 0° here is perpendicular to the radiation exit surface 2a of the layer sequence 2 and is identified by W=0° in FIGS. 1A and 1B. As is evident, CIEx decreases within the CIE color space as the emission angle increases, which results in a poor color homogeneity of the overall radiation.

Figure 1D:
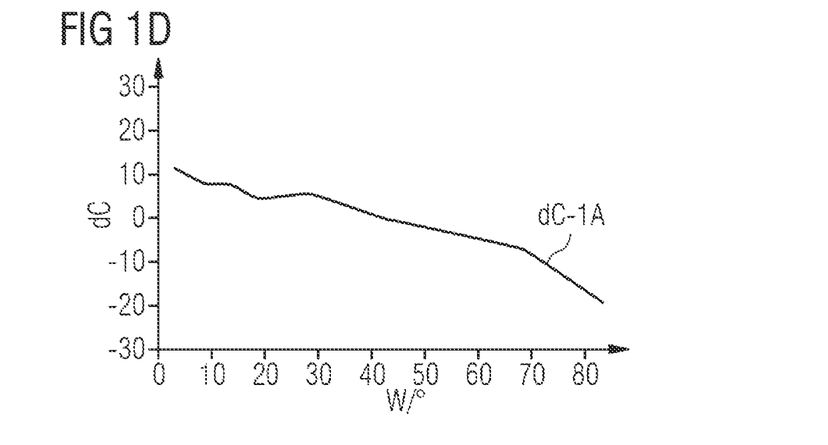
FIGS. 1D, 2C, 3D and 4C show the change in the chromatic aberration as a function of the emission angle.

The diagram illustrated in FIG. 1D shows the change in the chromatic aberration dC within the CIE color space (1931) as a function of the emission angle of the overall radiation of the optoelectronic component illustrated in FIG. 1A and FIG. 1B, respectively. The change in the chromatic aberration dC is calculated as follows:

$$dC = 1000\sqrt{\Delta CIEx^2 + \Delta CIEy^2} * \begin{cases} -1, & \Delta CIEx + \Delta CIEy < 0 \\ 1, & \Delta CIEx + \Delta CIEy \geq 0 \end{cases}$$

where $\Delta CIEx = CIEx - CIEx_0$ and $\Delta CIEy = CIEy - CIEy_0$, wherein CIEx and CIEy represent the ascertained values at the respective emission angle and $CIEx_0$ and $CIEy_0$ represent the values averaged over the entire emission. As is evident, the chromatic aberration decreases as the emission angle increases in accordance with a color shift in the blue range, which shows the poor color homogeneity of the overall radiation of a component in accordance with FIG. 1A and FIG. 1B, respectively.

Figure 2A:
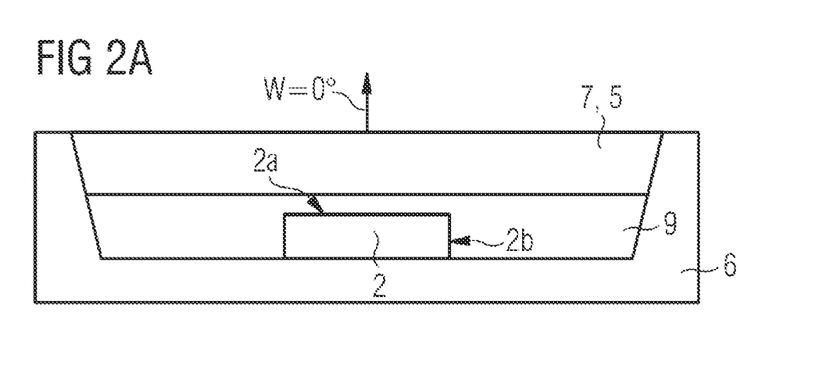

FIG. 2A shows a further optoelectronic component 1 as a comparative example. The optoelectronic component 1 includes a housing 6 having a cutout 7. A layer sequence 2 having an active layer (not shown here) is arranged in the cutout 7. The layer sequence 2 is arranged above a substrate, for example composed of sapphire, in the cutout 7 of the housing (not shown here). During operation of the component 1, the layer sequence 2 emits an electromagnetic primary radiation in the blue range of the electromagnetic spectrum. The layer sequence 2 is volume emitting, that is to say that the radiation is emitted via the radiation exit surface 2a and the side surfaces 2b. A potting layer 9 including a second matrix material and a conversion potting 5 is arranged above the layer sequence 2. The conversion potting 5 consists of the second matrix material and a converter material. The converter material is, in particular, a phosphor which emits in the yellow spectral range and which converts the blue primary radiation partly into a yellow secondary radiation. The second matrix material can be a silicone. The conversion potting 5 completely fills the cutout 7 of the housing 6. The component 1 emits a white overall radiation. An emission angle W of the overall radiation of 0° is perpendicular to the radiation exit surface 2a of the layer sequence 2 and is identified by W=0° in FIG. 2A. The primary radiation and the secondary radiation have different intensity ratios depending on emission angles. This results in a change in the perceived color of the white overall radiation depending on the viewing angle of the component. In this case, the proportion of blue primary radiation in the white overall radiation rises toward larger emission angles. This is manifested in particular in increasing color coordinates CIEx and CIEy toward larger emission angles. This problem becomes particularly apparent if the ratio of primary radiation coupled out to secondary radiation coupled out is high, that is to say for example if cold-white light having a high proportion of blue primary radiation is intended to be coupled out. Alternatively, the potting layer 9 can also additionally be embodied as conversion potting 5 (not shown). This alternative embodiment exhibits the same emission behavior.

Figure 2B:
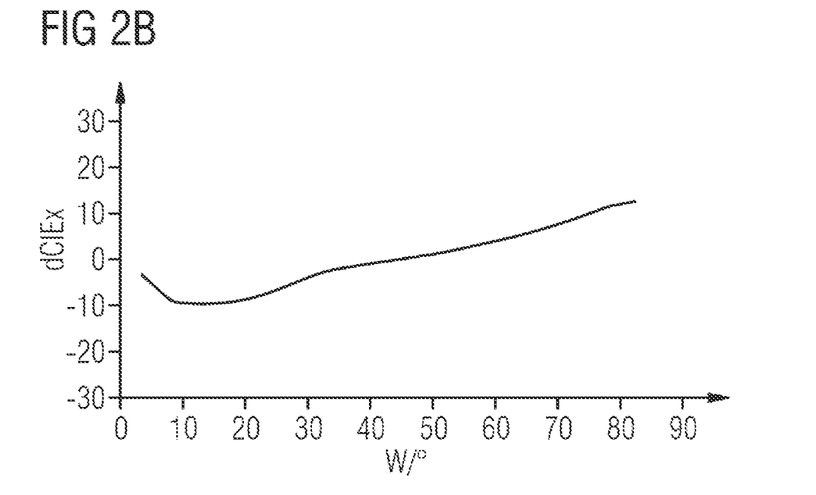

The diagram illustrated in FIG. 2B shows the profile of the change in the color coordinate CIEx within the CIE color space dCIEx as a function of the emission angle of the overall radiation of the optoelectronic component illustrated in FIG. 2A. In this case, the emission angle W in degrees is plotted on the x-axis and the change in the color coordinate CIEx within the CIE color space dCIEx is plotted on the y-axis. dCIEx is calculated in the manner as described with respect to FIG. 1B. In this case, an emission angle W of the overall radiation of 0° is perpendicular to the radiation exit surface 2a of the layer sequence 2 and is identified by W=0° in FIG. 2A. As is evident, CIEx increases within the CIE color space as the emission angle increases, which results in a poor color homogeneity of the overall radiation.

Figure 2C:
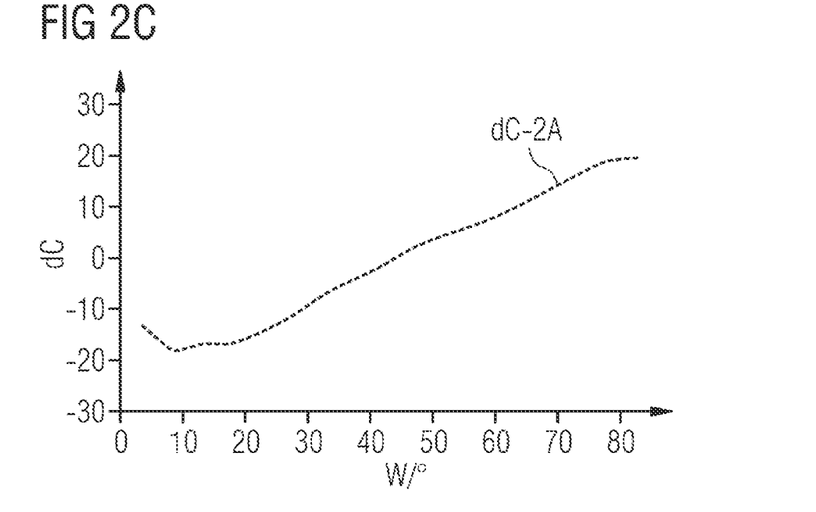

The diagram illustrated in FIG. 2C shows the change in the chromatic aberration dC within the CIE color space (1931) as a function of the emission angle of the overall radiation of the optoelectronic component illustrated in FIG. 2A. The change in the chromatic aberration dC is calculated in the manner as described with respect to FIG. 1C. As is evident, the chromatic aberration increases as the emission angle increases in accordance with a color shift in the yellow range, which shows the poor color homogeneity of the overall radiation of a component in accordance with FIG. 2A.

Figure 3A:
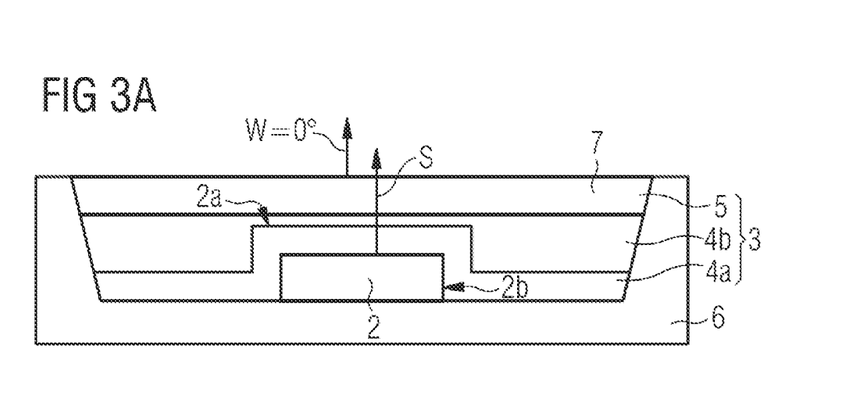
FIGS. 3A, 5A and 5B show exemplary embodiments of optoelectronic components.
Figure 3B:
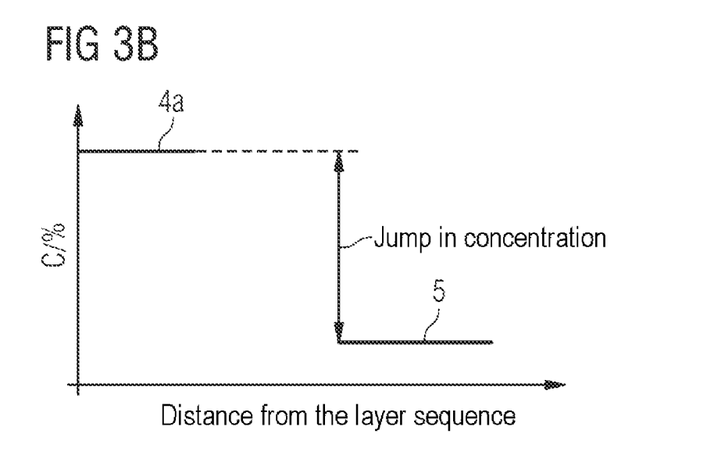
FIGS. 3B, 3E and 5C show the jump in concentration of converter material between the conversion layer and the conversion potting.

FIG. 3A shows one exemplary embodiment of an optoelectronic component 1. The optoelectronic component 1 includes a layer sequence 2 having an active layer (not shown here). The layer sequence 2 is arranged above a substrate (not shown here), for example composed of sapphire, in a cutout 7 of a housing 6. The housing 6 can have a length of 3 mm, a width of 3 mm and a height of 600 μm. The layer sequence 2 is configured to emit a primary radiation in the blue range of the electromagnetic spectrum during operation of the optoelectronic component 1. In the case of the layer sequence 2 in accordance with this embodiment, a higher proportion of primary radiation is emitted via the side surfaces 2b than via the radiation exit surface 2a. In other words, the primary radiation is not emitted with a Lambertian radiation distribution, rather the intensity of primary radiation rises toward high emission angles. The layer sequence 2 can have a height of 150 μm, for example. A conversion layer 4a is arranged above one main surface of the layer sequence, in particular the radiation exit surface 2a and the side surfaces 2b of the layer sequence. The radiation exit surface 2a can have an area of 0.5 mm², for example. The conversion layer 4a is in particular in direct contact with the layer sequence 2, in particular with the radiation exit surface 2a of the layer sequence and with the side surfaces 2b of the layer sequence. The conversion layer 4a has in particular a layer thickness of between 70 μm and 100 μm, for example of 75 μm. A matrix layer 4b having a layer thickness of 125 μm, for example, is arranged above the conversion layer 4a. The layer thickness of the conversion layer 4a and that of the matrix layer 4b are in particular together thicker than the height of the layer sequence 2. The conversion layer 4a consists of a first matrix material, for example a silicone, and a converter material. The converter material is, in particular, a phosphor which emits in the yellow spectral range and which converts the blue primary radiation partly into a yellow secondary radiation. By way of example, $Y_3Al_5O_{12}$:Ce is chosen as the phosphor. The matrix layer 4b consists of the first matrix material. In accordance with this embodiment, the matrix layer 4b is arranged between the conversion layer 4a and a conversion potting 5. The conversion potting 5 is arranged above the matrix layer 4b, fills the cutout 7 and consists of a second matrix material, for example a silicone, and the converter material. The converter material is distributed homogeneously in the second matrix material. The converter material of the conversion potting 5 and the converter material of the conversion layer 4a are the same converter materials and thus, for example, $Y_3Al_5O_{12}$:Ce. The conversion potting 5 can have a layer thickness of 150 μm. In particular, the first and second matrix materials can be an identical matrix material, for example a silicone. The conversion layer 4a, the matrix layer 4b and the conversion potting 5 form the conversion element 3, which is arranged in the beam path S of the primary radiation. The concentration of converter material in the converter layer 4a is greater than the concentration of converter material in the conversion potting 5, with the result that there is a jump in concentration of converter material between the conversion layer 4a and the conversion potting 5. In this case, in particular, the concentration of converter material can decrease suddenly between the conversion layer 4a and the conversion potting 5. Suddenly means that the concentration of converter material in the conversion layer 4a falls abruptly to the concentration in the conversion potting 5. This is shown in FIGS. 3B and 3E, in which the concentration of converter material C is plotted against the distance from the layer sequence 2. FIG. 3E includes, in contrast to FIG. 3B, the concentration of converter material in the matrix layer (with a concentration equal to zero) and thus the further jump in concentration between the concentration of converter material in the conversion layer 4a and the concentration of converter material in the matrix layer 4b.

In particular, in the conversion layer 4a the concentration of converter material is high and falls with the layer boundary of the conversion layer 4a abruptly to a concentration of converter material equal to zero in the matrix layer 4b. In the conversion potting 5 the concentration of the converter material is constant, in particular, but significantly lower than in the conversion layer 4a, and falls abruptly in comparison to the concentration of the converter material in the conversion layer 4a. The substance amount of the converter material within the conversion layer 4a is, for example, 80% to 97% inclusive relative to the total substance amount of converter material in the conversion element 3. The substance amount of the converter material within the conversion potting 5 is, for example, 20% to 3% inclusive relative to the total substance amount of converter material in the conversion element 3. The component 1 in FIG. 3A emits a white overall radiation as a result of the superimposition of the blue primary radiation and the yellow secondary radiation. In comparison with the components in FIGS. 1A and 2A, a conversion layer 4a and a conversion potting 5 are combined. The primary radiation and the secondary radiation, after emerging from the conversion layer 4a, have different intensity ratios depending on the emission angle. The proportion of blue primary radiation increases toward larger emission angles. Thereafter the primary radiation passes through the conversion potting 5.

The primary radiation, depending on the emission angle, exhibits oppositely occurring intensity ratios when emerging from the conversion potting 5 in comparison with emerging from the conversion layer 4a. The proportion of blue primary radiation decreases toward larger emission angles. As a result of the oppositely occurring intensity ratios of the primary radiation after emerging from the conversion potting 5 and after emerging from the conversion layer 4a, it is possible to compensate for the chromatic aberration arising as a result of the conversion layer 4a. This results in a constant or almost constant intensity ratio of the primary radiation over the emission angles, such that the component emits an overall radiation with a very good color homogeneity. What has proved to be particularly efficient with regard to the color homogeneity is a substance amount of converter material in the conversion layer 4a of approximately 90% relative to the total substance amount of converter material in the conversion element 3 and in particular also in relation to the total substance amount of the converter material in the conversion layer 4a of the component 1 from FIG. 1A, under the assumption that the amount of converter material of the components in FIGS. 1A and 3A is set such that they have or are intended to have the same white color locus.

The components in FIGS. 1A, 2A and 3A differ only in the configuration of the conversion element 3. In the component 1 in FIG. 1A the conversion element 3 is a conversion layer 4a, in the component 1 in FIG. 2A the conversion element 3 is a conversion potting 5, and in the component 1 in FIG. 3A the conversion element 3 is composed of a conversion layer 4a, a matrix layer 4b and a conversion potting 5.

Figure 3C:
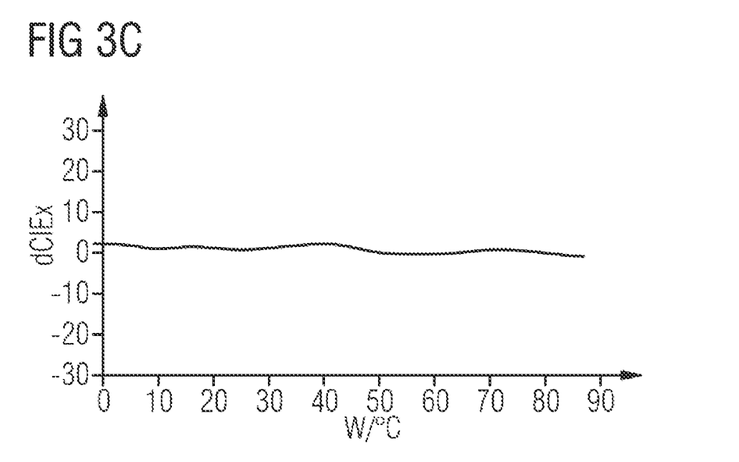

FIG. 3C shows the profile of the change in the color coordinate CIEx within the CIE color space dCIEx as a function of the emission angle of the overall radiation of the exemplary embodiment of an optoelectronic component that is illustrated in FIG. 3A. In this case, the emission angle W in degrees is plotted on the x-axis and the change in the color coordinate CIEx within the CIE color space dCIEx is plotted on the y-axis. dCIEx is calculated as described with respect to FIG. 1B. In this case, an emission angle W of the overall radiation of 0° is perpendicular to the radiation exit surface 2a of the layer sequence 2 and is identified by W=0° in FIG. 3A. The dashed curves involve measured minimum or maximum deviations of the rotationally symmetrical emission at the respective emission angle. The curve identified by M involves the average value of the measured deviations. As is evident, as the emission angle increases, CIEx hardly changes within the CIE color space, that is to say is almost constant, which shows the very high color homogeneity of the overall radiation of the component.

Figure 3D:
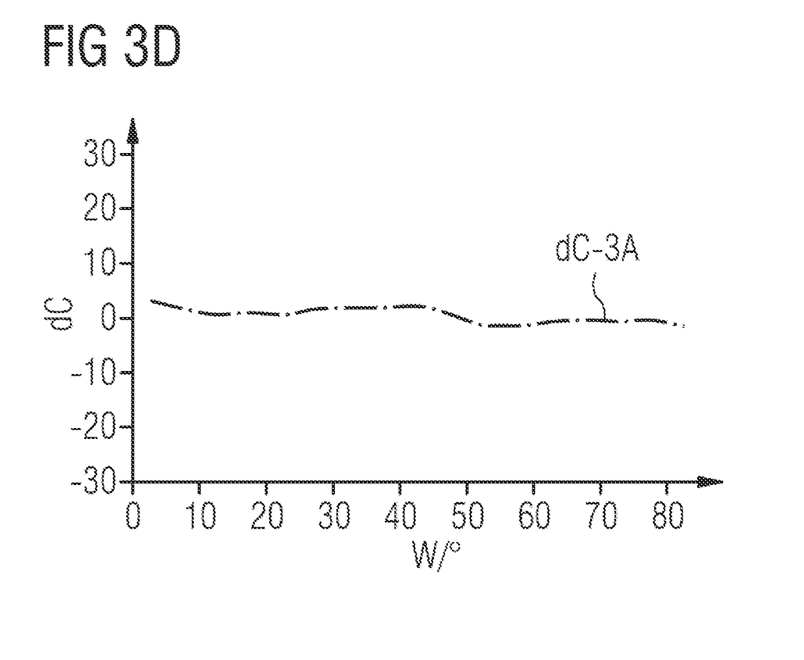
Figure 3E:
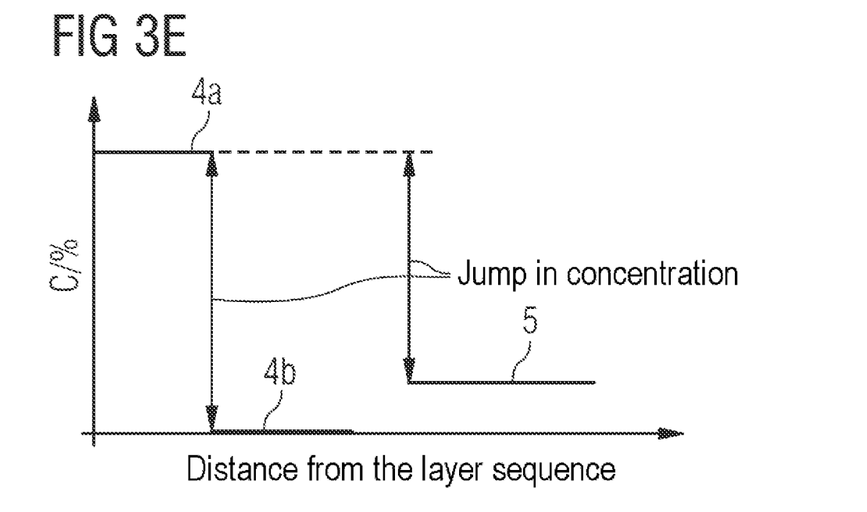

The diagram illustrated in FIG. 3D shows the change in the chromatic aberration dC within the CIE color space (1931) as a function of the emission angle of the overall radiation of the optoelectronic component illustrated in FIG. 3A. The change in the chromatic aberration dC is calculated as described with respect to FIG. 1C. As is evident, as the emission angle increases, the color locus hardly changes and is thus largely constant.

Figure 4A:
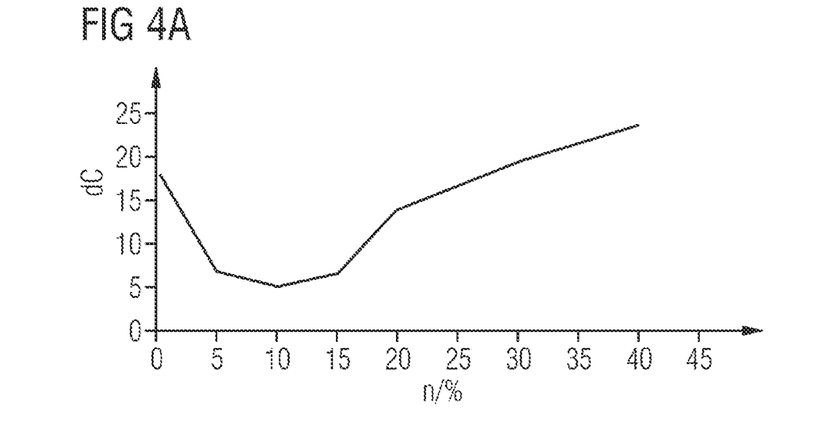
FIG. 4A shows the change in the color profile as a function of the change in the proportion of the substance amount n of the converter material in the conversion layer.

In FIG. 4A, the chromatic aberration dC is plotted against the reduction of the concentration of the converter material in the conversion layer relative to the substance amount of the converter material in a comparable construction from FIG. 1A. dC is calculated as described with respect to FIG. 1D. As is evident, the chromatic aberration dC is minimized in particular in the case of a reduction of the concentration of the converter material within the conversion layer of 3 to 20%, such as 4 to 16%, alternatively 10%, relative to the substance amount of converter material in a comparable construction from FIG. 1A. This corresponds to a substance amount of the converter material within the conversion layer of 80 to 97% inclusive, such as 84% to 96% inclusive, alternatively 90%, relative to the substance amount of converter material in a comparable construction from FIG. 1A.

Figure 4B:
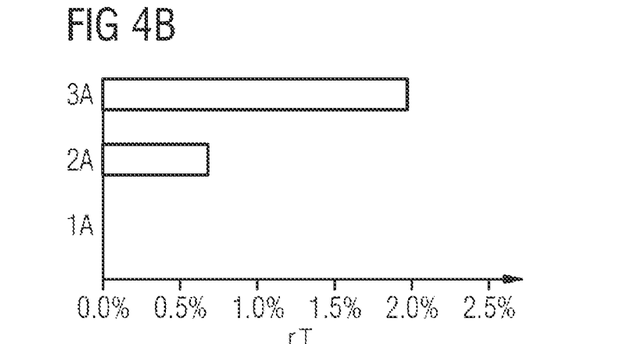
FIG. 4B shows a comparison of the luminous flux of various components.

FIG. 4B illustrates the relative increase in the luminous flux rI in percent for the components from FIGS. 1A, 2A and 3A. Here the component from FIG. 3A has, in comparison with the component from FIG. 1A, a luminous flux increased by approximately 2% and thus higher efficiency.

Figure 4C:
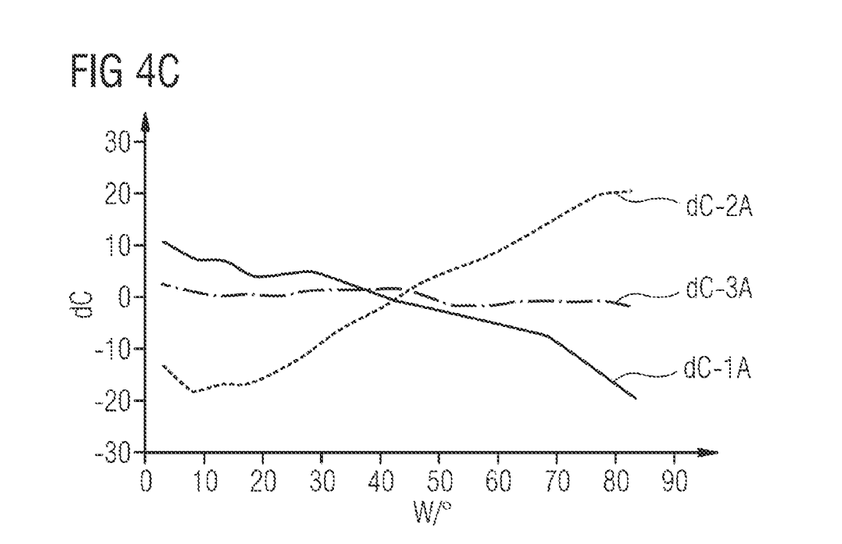

The diagram illustrated in FIG. 4C shows the change in the chromatic aberration dC within the CIE color space (1931) as a function of the emission angle of the overall radiation from FIGS. 1C, 2C and 3C in a comparison. In contrast to the components illustrated in FIGS. 1A and 2A, the component from FIG. 3A exhibits a constant or almost constant color locus of the overall radiation as a function of the emission angle.

Figure 5A:
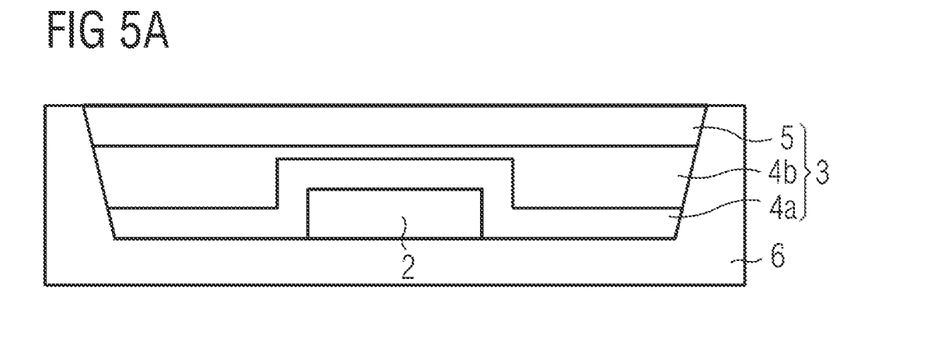

FIG. 5A shows a further exemplary embodiment of an optoelectronic component 1. In comparison with the optoelectronic component 1 from FIG. 3A, the optoelectronic component 1 includes scattering particles in the matrix layer 4b. As a result, the color homogeneity and thus the emission characteristic of the component can once again be increased.

Figure 5B:
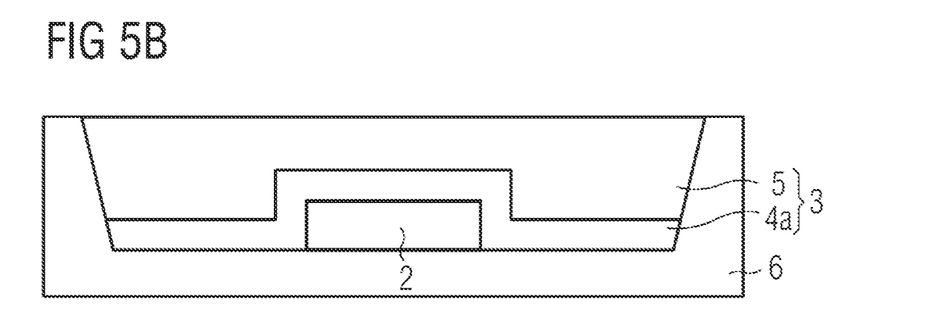
Figure 5C:
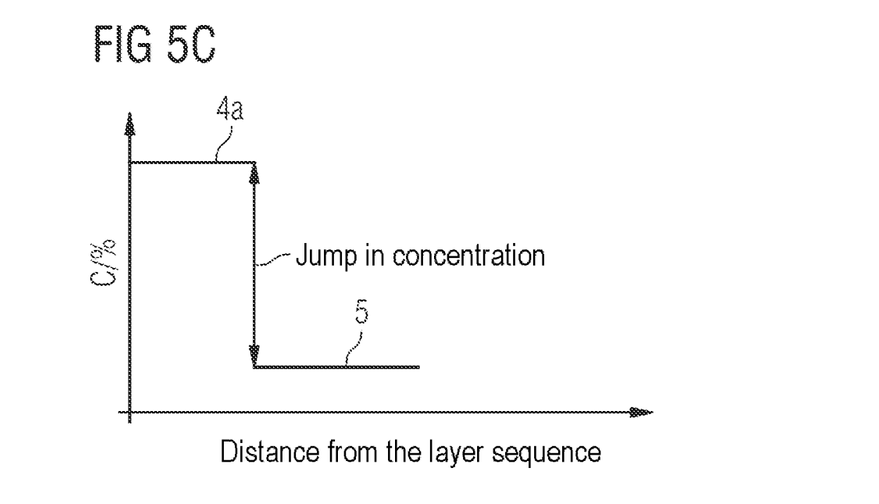

FIG. 5B shows a further exemplary embodiment of an optoelectronic component 1. In comparison with the optoelectronic component 1 from FIG. 3A, the optoelectronic component 1 does not include a matrix layer 4b. The conversion layer 4a consists of a first matrix material, for example a silicone, and a converter material. The conversion layer 4a may have been produced by sedimentation just like the conversion layer 4a from FIG. 3A, and may thus correspond to the conversion layer 4a shown in FIG. 3A. After the sedimentation, the overlying layer, consisting of the matrix material (correspondingly the matrix layer 4b), is removed. In accordance with this embodiment, the concentration of converter material decreases suddenly with increasing distance from the layer sequence 2 and in particular upon the transition from the conversion layer 4a to the conversion potting 5. Suddenly means that the concentration of converter material falls abruptly upon the transition from the conversion layer 4a to the conversion potting 5. This is shown in FIG. 5C.

The invention described here is not restricted by the description on the basis of the exemplary embodiments; rather, the invention encompasses any novel feature and also any combination of features, which in particular includes any combination of features in the patent claims, even if this feature or this combination itself is not explicitly specified in the patent claims or exemplary embodiments.

LIST OF REFERENCE NUMBERS

1 Optoelectronic component
2 Layer sequence
2a Radiation exit surface
2b Side surface
3 Conversion element
4a Conversion layer
4b Matrix layer
5 Conversion potting
6 Housing
7 Cutout
8 Potting
9 Potting layer
W Emission angle M Profile of the change in the color coordinate CIEx (average value)
dCIEx Change in the color coordinate CIEx
dC Change in the chromatic aberration
dC-1A; dC-2A, dC-3A Profile of the change in the chromatic aberration
rI Relative intensity
% Percent
° Degrees
S Beam path of the primary radiation
C Concentration

The invention claimed is:

1. An optoelectronic component comprising:
a continuous one-piece housing having a cutout; wherein the continuous one-piece housing comprises a bottom surface and two sidewall surfaces connected to the bottom surface where the two sidewall surfaces are at opposite ends of the bottom surface;
a layer sequence having an active layer configured to emit an electromagnetic primary radiation during operation of the component; wherein the layer sequence is arranged in the cutout; wherein the layer sequence has a radiation exit surface and side surfaces; wherein the layer sequence is arranged over the bottom surface of the continuous one-piece housing;
a conversion element arranged in the beam path of the electromagnetic primary radiation; wherein the conversion element comprises:
a conversion layer comprising a first matrix material and a converter material;
wherein the conversion layer is arranged in the cutout; and
a conversion potting arranged over the conversion layer comprising a second matrix material and a converter material; wherein the conversion potting has a thickness greater than a thickness of the conversion layer, wherein the thickness of the conversion potting and the thickness of the conversion layer are measured in a direction perpendicular to the bottom surface of the housing;
wherein there is a jump in concentration of converter material between the conversion layer and the conversion potting, and wherein the converter material is configured to at least partially convert the electromagnetic primary radiation into a yellow electromagnetic secondary radiation during operation of the component;
wherein the conversion layer comprises an amount of the converter material ranging from 80% to 97% relative to the total amount of converter material in the conversion element; and
wherein the conversion potting comprises an amount of the converter material ranging from 3% to 20% relative to the total amount of converter material in the conversion element.

2. The optoelectronic component as claimed in claim 1, wherein the concentration of the converter material in the conversion layer is at least three times as high as the concentration of the converter material in the conversion potting.

3. The optoelectronic component as claimed in claim 1, wherein the thickness of the conversion layer ranges from 50 μm to 150 μm inclusive.

4. The optoelectronic component as claimed in claim 1, wherein the conversion element comprises a matrix layer arranged between the conversion layer and the conversion potting and the matrix layer comprises the first matrix material.

5. The optoelectronic component as claimed in claim 4, wherein the matrix layer is free of the converter material.

6. The optoelectronic component as claimed in claim 4, wherein the matrix layer consists of the first matrix material.

7. The optoelectronic component as claimed in claim 1, wherein the first matrix material and the second matrix material are identical.

8. The optoelectronic component as claimed in claim 1, wherein the conversion potting envelops the conversion layer or the matrix layer in a positively locking manner.

9. The optoelectronic component as claimed in claim 1, wherein the component emits a wide overall radiation during operation.

10. The optoelectronic component as claimed in claim 1, wherein the component comprises at least one further layer sequence for emitting a primary radiation and the conversion element is arranged in the beam path of the electromagnetic primary radiation of the at least one further layer sequence.

11. The optoelectronic component as claimed in claim 1, wherein the converter material is distributed homogeneously in the conversion potting.

12. The optoelectronic component as claimed in claim 1, wherein the first matrix material and the second matrix material comprise a silicon-based material.

13. The optoelectronic component as claimed in claim 1, wherein the layer sequence is a volume-emitting layer sequence.

14. The optoelectronic component as claimed in claim 1, wherein the converter material comprises $Y_3Al_5O_{12}$:Ce.

15. The optoelectronic component as claimed in claim 1, wherein the thickness of the conversion potting is at least 50% greater than the thickness of the conversion layer.

16. An optoelectronic component comprising:
a layer sequence having an active layer configured to emit an electromagnetic primary radiation during operation of the component;
a conversion element arranged in the beam path of the electromagnetic primary radiation; wherein the conversion element comprises:
a conversion layer comprising a first matrix material and a converter material;
wherein the conversion layer is arranged in the cutout; and
a conversion potting arranged over the conversion layer comprising a second matrix material and a converter material; wherein the conversion potting has a thickness greater than a thickness of the conversion layer, wherein the thickness of the conversion potting and the thickness of the conversion layer are measured in a direction perpendicular to the bottom surface of the housing;
wherein there is a jump in concentration of converter material between the conversion layer and the conversion potting;
wherein the conversion layer comprises an amount of the converter material ranging from 80% to 97% relative to the total amount of converter material in the conversion element; and
wherein the conversion potting comprises an amount of the converter material ranging from 3% to 20% relative to the total amount of converter material in the conversion element.

17. A method for producing an optoelectronic component as claimed in claim 16, wherein the method comprises:
providing a layer sequence having an active layer;
applying a first matrix material and a converter material to the layer sequence;

sedimenting the converter material into the first matrix material to form a conversion layer and an overlying matrix layer free of the converter material arranged over the conversion layer;

applying a conversion potting above the conversion layer; wherein the conversion potting comprises a second matrix material and the converter material.

18. The method as claimed in claim 17, further comprising removing the overlying layer free of the converter material.

19. The optoelectronic component as claimed in claim 16, wherein the thickness of the conversion potting is at least 50% greater than the thickness of the conversion layer.

* * * * *